United States Patent
Gordon et al.

(10) Patent No.: US 9,269,689 B1
(45) Date of Patent: *Feb. 23, 2016

(54) SINGLE SIDED, FLAT, NO LEAD, INTEGRATED CIRCUIT PACKAGE

(71) Applicant: Maxim Integrated Products, Inc., San Jose, CA (US)

(72) Inventors: Jeff A. Gordon, Plano, TX (US); Steven Hass, Dallas, TX (US); Hal Kurkowski, Dallas, TX (US); Scott Jones, Highland Village, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/724,894

(22) Filed: Dec. 21, 2012

Related U.S. Application Data

(60) Continuation of application No. 11/697,260, filed on Apr. 5, 2007, now Pat. No. 8,338,955, which is a division of application No. 11/128,052, filed on May 11, 2005, now Pat. No. 7,675,166.

(51) Int. Cl.
  *H01L 23/48* (2006.01)
  *H01L 23/00* (2006.01)

(52) U.S. Cl.
  CPC ............... *H01L 24/46* (2013.01); *H01L 24/85* (2013.01)

(58) Field of Classification Search
  USPC .......... 257/773, E23.079, E21.002, 726, 727; 438/106
  See application file for complete search history.

(56) References Cited

U.S. PATENT DOCUMENTS

| | | | |
|---|---|---|---|
| 3,921,201 A | 11/1975 | Eisele et al. | 257/14 |
| 4,961,088 A | 10/1990 | Gilliland et al. | 399/25 |
| 5,049,898 A | 9/1991 | Arthur et al. | 347/19 |
| 5,191,405 A | 3/1993 | Tomita et al. | 257/777 |
| 5,272,503 A | 12/1993 | LeSueur et al. | 399/25 |
| 5,491,540 A | 2/1996 | Hirst | 399/12 |
| 5,699,091 A | 12/1997 | Bullock et al. | 347/19 |
| 6,039,430 A | 3/2000 | Helterline et al. | 347/19 |
| 6,094,057 A | 7/2000 | Hiruta et al. | |
| 6,433,277 B1 | 8/2002 | Glenn | 174/537 |
| 6,455,356 B1 | 9/2002 | Glenn et al. | 438/123 |
| 6,547,570 B2 | 4/2003 | Eskildsen et al. | 439/71 |
| 6,630,728 B2 | 10/2003 | Glenn | 257/670 |
| 6,731,000 B1 | 5/2004 | Haque et al. | 257/730 |

(Continued)

FOREIGN PATENT DOCUMENTS

| | | |
|---|---|---|
| JP | 01210393 | 8/1989 |
| JP | 2002026193 | 1/2002 |
| JP | 2006-80145 A | 3/2006 |

*Primary Examiner* — Timor Karimy
(74) *Attorney, Agent, or Firm* — Advent, LLP

(57) ABSTRACT

An integrated circuit package comprising an enclosure including a dielectric housing, a first electrical contact, and a second electrical contact. The dielectric housing, the first electrical contact, and the second electrical contact are configured to form a contact side of the enclosure. In addition, the first and second electrical contacts are sized to be substantially alignment insensitive for electro-mechanical connection to corresponding contacts of an end-use equipment. The enclosure encapsulates an integrated circuit die which is electrically coupled to the first and second electrical contacts. The alignment insensitive first and second electrical contacts may be electro-mechanically connected to corresponding contacts of an end-use equipment (e.g., a printer). Further, the integrated circuit package may be hosted by a peripheral device (e.g., a printer cartridge).

22 Claims, 3 Drawing Sheets

(56) References Cited

U.S. PATENT DOCUMENTS

| | | |
|---|---|---|
| 6,888,072 B2 | 5/2005 | Tsukamoto et al. |
| 6,956,284 B2 | 10/2005 | Cady et al. .................... 257/685 |
| 7,675,166 B2 | 3/2010 | Gordon et al. ................ 257/726 |
| 8,338,955 B2 | 12/2012 | Gordon et al. ................ 257/773 |
| 2001/0020743 A1 | 9/2001 | Eldridge et al. .............. 257/737 |
| 2001/0027034 A1 | 10/2001 | Eskildsen et al. |
| 2001/0048591 A1 | 12/2001 | Fjelstad et al. ................ 361/767 |
| 2003/0063311 A1 | 4/2003 | Covitt et al. |
| 2003/0081647 A1 | 5/2003 | Brett et al. ...................... 374/49 |
| 2004/0140217 A1 | 7/2004 | Herchen ....................... 204/622 |
| 2005/0012187 A1 | 1/2005 | Kameyama et al. .......... 257/676 |
| 2005/0046036 A1 | 3/2005 | Iwasaki ......................... 257/777 |
| 2006/0050454 A1 | 3/2006 | Koudate et al. ................ 361/56 |

SINGLE SIDED, FLAT, NO LEAD, INTEGRATED CIRCUIT PACKAGE

CROSS REFERENCE TO A RELATED APPLICATION

This application is a divisional of and claims priority to U.S. patent application Ser. No. 11/128,025, filed on May 11, 2005, and entitled "Single-sided, Flat, No Lead, Integrated Circuit Package", which is incorporated herein by reference.

FIELD OF THE INVENTION

This invention relates generally to integrated circuit packages, and in particular, to an integrated circuit package comprising an enclosure including a dielectric housing and two or more electrical contacts configured to form a substantially flat contact side of the enclosure for direct electro-mechanical contact to an end-use equipment. Accordingly, the size of the contacts can be large enough to facilitate relatively large alignment tolerances within the system that utilizes the package. The enclosure encapsulates an integrated circuit die and wirebonds connecting the integrated circuit die to the internal sides of the contacts.

BACKGROUND OF THE INVENTION

Integrated circuit packages, such as small outline integrated circuits (SOICs) or small outline transistors (SOTs), typically consist of an epoxy plastic housing enclosing an integrated circuit die, and a lead frame consisting of a plurality of electrical contacts extending from the inside to the outside of the housing. Wirebonds situated within the housing electrically connect the integrated circuit die to the plurality of electrical contacts of the lead frame.

Generally, such integrated circuit package is soldered onto a printed circuit board. The printed circuit board including the integrated circuit package are then assembled onto an end-use equipment. This may require attachment of the printed circuit board to the end-use equipment using screws, adhesive, plastic staking, or other means. For certain applications where costs should be minimized, such a three-step process of forming the integrated circuit package, soldering it onto a printed circuit board, and then assembling the printed circuit board to an end-use equipment is not suitable because it is overly complicated, time consuming, and expensive.

SUMMARY OF THE INVENTION

An aspect of the invention relates to an integrated circuit package, comprising an enclosure including a dielectric housing, a first electrical contact, and a second electrical contact. The dielectric housing, the first electrical contact, and the second electrical contact are configured to form a contact side of the enclosure. In addition, the first and second electrical contacts are sized to be substantially alignment insensitive for electro-mechanical connection to corresponding contacts of an end-use equipment. The enclosure encapsulates an integrated circuit die which is electrically coupled to the first and second electrical contacts.

In the exemplary embodiment of the integrated circuit package, the contact side of the enclosure is substantially flat. Also, at least a portion of the (or the entire) integrated circuit die is disposed on the internal side of the first electrical contact. The integrated circuit package may include first and second electrical conductors (e.g., wirebonds) that electrically connect the integrated circuit die to the internal sides of the first and second electrical contacts. The substantially alignment insensitive first and second electrical contacts may each have a dimension of at least two millimeters by at least two millimeters.

Also in the exemplary embodiment of the integrated circuit package, the integrated circuit die may be configured as a memory device containing information related to a peripheral device hosting the integrated circuit package. Alternatively, or in addition to, the integrated circuit die may be configured as an authentication device for authenticating the peripheral device hosting the integrated circuit package. Such an authentication device may perform a secure hash algorithm (e.g., SHA-1, SHA-256), a cryptographic operation, and/or a password entry operation. Alternatively, or in addition to, the integrated circuit die may be configured as a calibration device used for calibrating an end-use equipment.

Other aspects of the invention relates to a method of forming the integrated circuit package described above, and an apparatus that includes the integrated circuit package as described above in electrical contact with an end-use equipment. In particular, the at least first and second electrical contacts of the integrated circuit package make electro-mechanical connection to at least first and second electrical contacts of the end-use equipment, respectively. The integrated circuit package may be secured to the end-use equipment by any number of devices, such as clamps, spring-loaded devices, adhesive, and others. The integrated circuit package may be hosted by a hosting device. As an example, the end-use equipment may be a printer, and the hosting device may be a printer cartridge.

Other aspects, features, and techniques of the invention will be apparent to one skilled in the relevant art in view of the following detailed description of the exemplary embodiments of the invention.

DETAILED DESCRIPTION OF THE EXEMPLARY EMBODIMENTS

Figure 1:
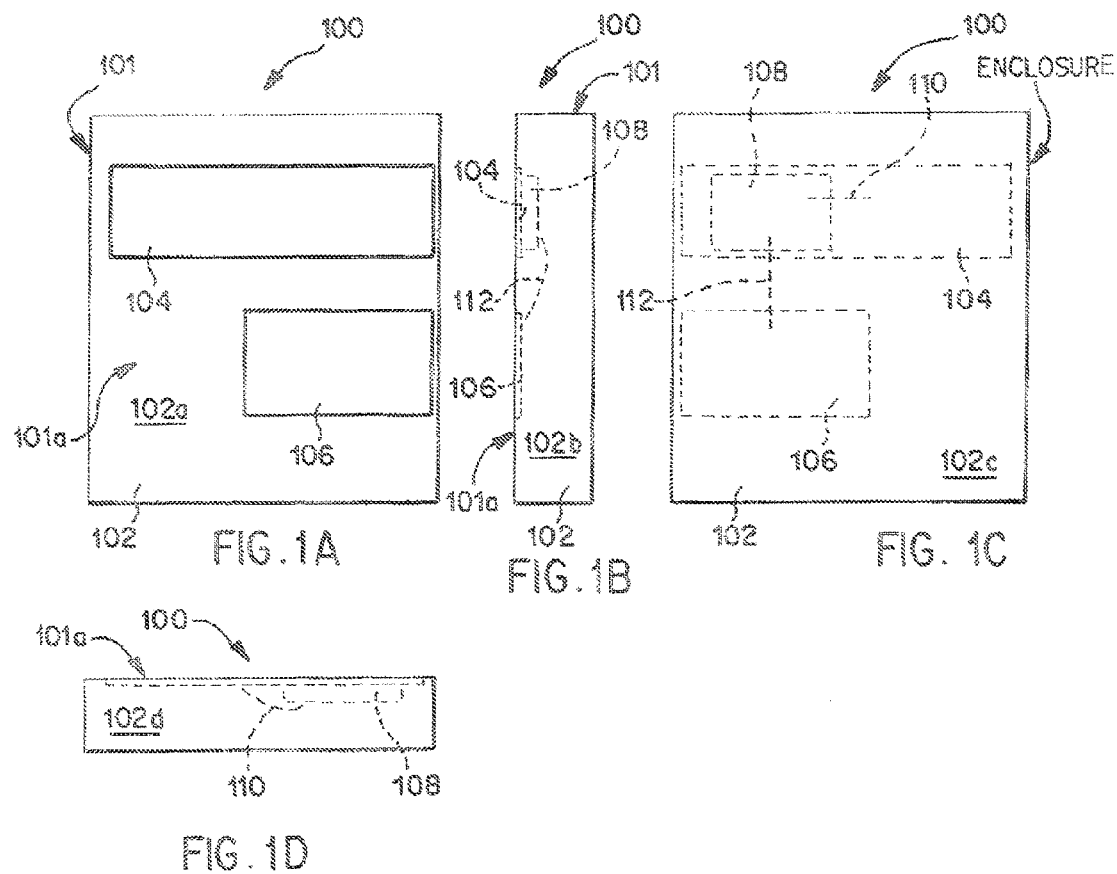
FIG. 1A illustrates a bottom (contact side) view of an exemplary integrated circuit package in accordance with an embodiment of the invention.
FIG. 1B illustrates a first side view of the exemplary integrated circuit package.
FIG. 1C illustrates a top (internal side) view of the exemplary integrated circuit.
FIG. 1D illustrates a second side view (orthogonal to the first side view) of the exemplary integrated circuit package.

FIGS. 1A to 1D illustrate various views of an exemplary integrated circuit package 100 in accordance with an embodiment of the invention. The integrated circuit 100 comprises an enclosure 101 including a housing 102 made of a dielectric material (e.g., an epoxy plastic) and a pair of electrical (e.g., metal) contacts 104 and 106. In this example, the housing 102 is configured into a solid rectangle having orthogonal sides 102a, 102b, 102c, and 102d. It shall be understood that the housing 102 may be configured into other shapes.

The housing 102 and the electrical contacts 104 and 106 are configured to form a substantially flat contact side 101a of the enclosure 101. The side 101a is referred to as the "contact" side because it is the side that makes electro-mechanical contact to an end-use equipment, as later discussed. The integrated circuit package 100 also includes an integrated circuit die 108 disposed entirely on the internal side of the contact 104. In addition, the integrated circuit package 100 includes a pair of wirebonds 110 and 112 electrically connecting the integrated circuit die 108 to the internal sides of the contacts 104 and 106, respectively. In this configuration, the enclosure 101, which includes the housing 102 and the contacts 104 and 106, substantially encapsulates the integrated circuit die 108 and the wirebonds 110 and 112.

A contact, as defined herein, is for facilitating the electrical connection of the integrated circuit die 108 to a device external to the integrated circuit package 100, such as an end-use equipment. For example, the contact 104 may serve as a ground contact to provide a ground potential to the integrated circuit die 108 from an end-use equipment. The other contact 106 may serve, for example, as a power and communication contact to provide a power signal (e.g., Vcc) to the integrated circuit die 108 from an end-use equipment, and communication between the integrated circuit die 108 and an end-use equipment. Although, in this example, the integrated circuit package 100 includes two contacts 104 and 106, it shall be understood that the integrated circuit package 100 may include any number of contacts. For example, the integrated circuit package 100 may be configured to have three or four contacts on the contact side 101a of the enclosure 101. One such contact may serve as a ground contact; another may serve as a power contact; and the remaining contact(s) may serve as communication contact(s).

For electrical-mechanical connections, the size of the contacts 104 and 106 should be large enough to make them relatively alignment insensitive for electrical-mechanical connection to corresponding contacts of an end-use equipment. For example, the length of such contact should be at least two (2) millimeters, and the width of such contact should be at least two (2) millimeters.

The integrated circuit package 100 may be used in any type of application. For example, the integrated circuit package 100 may serve as a memory device, authentication device, calibration device, and/or an identification device. These are merely examples. Other applications are contemplated.

Figure 2:
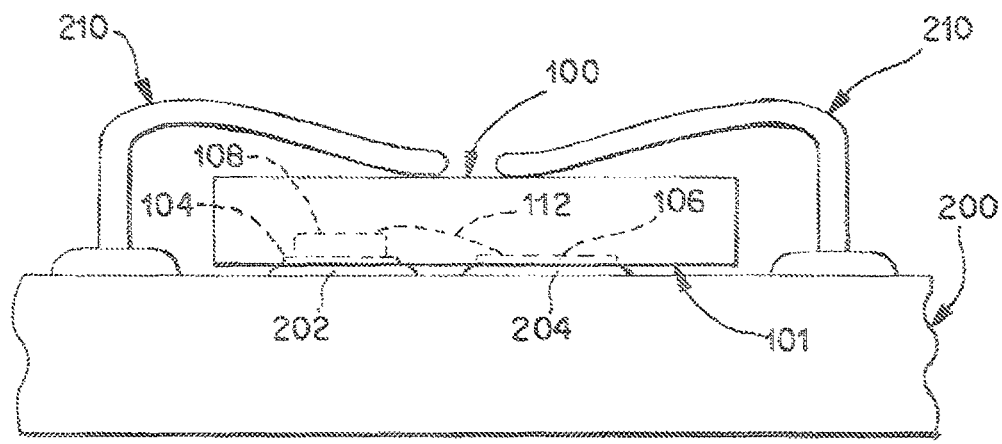
FIG. 2 illustrates a side view of the exemplary integrated circuit package in electrical-mechanical contact with an end-use equipment in accordance with another embodiment of the invention.

FIG. 2 illustrates a side view of the exemplary integrated circuit package 100 in electrical contact with an end-use equipment 200 in accordance with another embodiment of the invention. The end-use equipment 200 may be of any type, including peripherals and/or accessories, such as glucose meter calibrators, printer cartridges and others. In this example, the end-use equipment 200 comprises a pair of electrical contacts 202 and 204, and a pair of clamping devices 210.

The integrated circuit package 100 is disposed on the end-use equipment 200 in a manner that the contacts 104 and 106 make electrical contact with the contacts 202 and 204 of the end-use equipment 200, respectively. The clamping device 210 secures the integrated circuit package 100 to the end-use equipment 200 so that the integrated circuit contacts 104 and 106 make a desired electro-mechanical connection to the equipment contacts 202 and 204, respectively. It shall be understood that other devices, such as spring-loaded devices, can be used to apply positive pressure on the integrated circuit package 100 in order to provide this desired electro-mechanical connection.

The integrated circuit package 100 facilitates the assembly of the package to an end-use equipment. First, there is no need to solder the integrated circuit package 100 to a printed circuit board. This is because the integrated circuit package 100 may be attached directly to an end-use equipment. Thus, the step of soldering an integrated circuit package to a printed circuit board may be eliminated. Second, there is no need for a complicated attachment of the integrated circuit package 100 to an end-use equipment. As discussed above, the integrated circuit package 100 may be attached to an end-used equipment by a simple clamp, spring-loaded device, staking, adhesive, or other devices.

Figure 3:
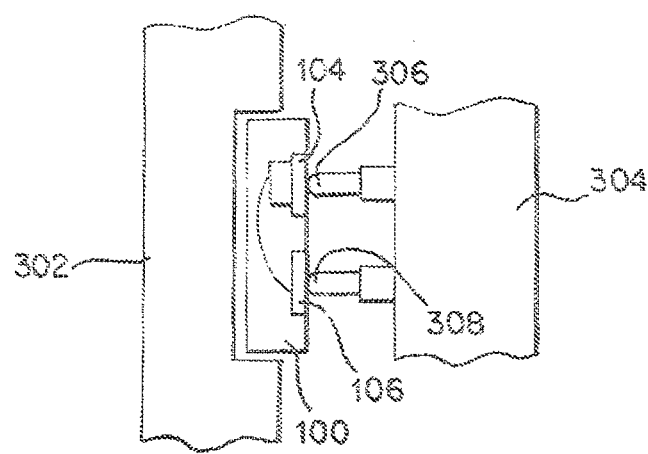
FIG. 3 illustrates a side view of the exemplary integrated circuit package mounted on an exemplary hosting device and electrically-mechanically connected to an exemplary end-use equipment in accordance with another embodiment of the invention.

FIG. 3 illustrates a side view of the exemplary integrated circuit package 100 mounted on an exemplary peripheral device 302 and electrically-mechanically connected to an exemplary end-use equipment 304 in accordance with another embodiment of the invention. In this example, the integrated circuit package 100 is hosted by (e.g., mounted on, attached to) the peripheral device 302, which could be, for example, a printer cartridge. The contacts 104 and 106 of the integrated circuit package 100 is electrically-mechanically connected to respective spring-loaded contacts 306 and 308 of an end-use equipment, which could be, for example, a printer or computer. In this example, the integrated circuit package 100 may encapsulate a memory device containing information about the peripheral device 302, such as, for example, the make and model of the printer cartridge, and be adapted to provide such information to the end-use equipment 304. Alternatively, the integrated circuit package may encapsulate an authentication device, such as a device that performs secure hash algorithms (SHA), like SHA-1 and SHA-256, cryptographic operations, and/or password entry operations.

Since the integrated circuit package 100 includes contacts 104 and 106 large enough to render them relatively alignment insensitive, the integrated circuit package 100 is able to be electrically connected to an end-use equipment 304 without the need for soldering them together.

Figure 4:
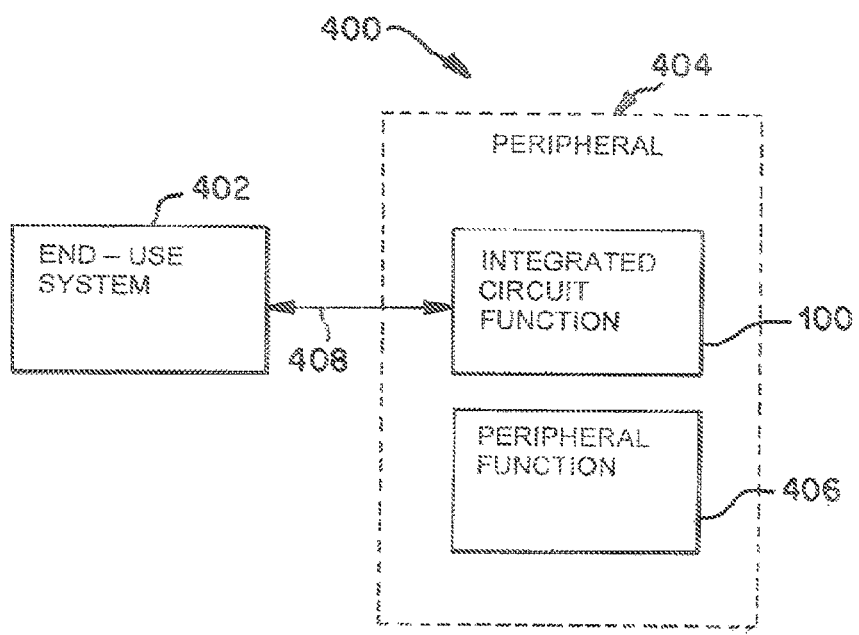
FIG. 4 illustrates a block diagram of an exemplary system incorporating the exemplary integrated circuit package in accordance with another embodiment of the invention.

FIG. 4 illustrates a block diagram of an exemplary system 400 incorporating the exemplary integrated circuit package 100 in accordance with another embodiment of the invention. The system 400 includes an end-use system 402 electrically coupled to the integrated circuit package 100 by way of an electrical-mechanical connection 408. The end-use system 402 may be a printer, computer or other equipment. The integrated circuit package 100 may be hosted by a system peripheral device 404, such as, for example, a printer cartridge. The system peripheral device 404 may include a peripheral function module 406 to perform the primary function of the system peripheral device 404, such as, for example, to provide toner or ink to the printer 402. In this example, the integrated circuit package 100 may encapsulate a memory device containing information about the peripheral device 404, such as, for example, the make and model of the printer cartridge, and be adapted to provide such information to the end-use system 402. Alternatively, the integrated circuit package may encapsulate an authentication device, such as a device that performs secure hash algorithms (SHA), like SHA-1 and SHA-256, cryptographic operations, and/or password entry operations. In this case, without a successful authentication of the end-use system 402 to the peripheral device 404 (or vice-versa), the peripheral function 406 may be inhibited.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

It is claimed:

1. An integrated circuit package, comprising:
    an enclosure comprising a dielectric housing, a first electrical contact, and a second electrical contact, said dielectric housing, said first electrical contact, and said second electrical contact forming a contact side of said enclosure, and said first and second electrical contacts sized to be substantially alignment insensitive to facilitate alignment tolerances for maintaining a direct bondless, and solderless, secure electro-mechanical connection to corresponding contacts of an end-use equipment when pressure is applied to the enclosure by the end-use equipment, the end-use equipment having a surface, the corresponding contacts mounted fixedly on the surface of the end-use equipment so that the corresponding contacts are flush against the surface; and
    an integrated circuit die situated within said enclosure and electrically coupled to said first and second electrical contacts.

2. The integrated circuit package of claim 1, wherein said contact side of said enclosure is substantially flat.

3. The integrated circuit package of claim 1, wherein at least a portion of said integrated circuit die is disposed on an internal side of said first electrical contact.

4. The integrated circuit package of claim 3, wherein said integrated circuit die is disposed entirely on said internal side of said first electrical contact.

5. The integrated circuit package of claim 1, wherein said integrated circuit package includes only said first and second electrical contacts.

6. The integrated circuit package of claim 1, further comprising an electrical conductor situated within said enclosure, wherein said electrical conductor is attached to said integrated circuit die and to an internal side of said first electrical contact.

7. The integrated circuit package of claim 6, wherein said electrical conductor comprises a wirebond.

8. The integrated circuit package of claim 1, further comprising an electrical conductor situated within said enclosure, wherein said electrical conductor is attached to said integrated circuit die and to an internal side of said second electrical contact.

9. The integrated circuit package of claim 8, wherein said electrical conductor comprises a wirebond.

10. The integrated circuit package of claim 1, wherein said first electrical contact includes a length of at least two millimeters and a width of at least two millimeters, and wherein said second electrical contact includes a length of at least two millimeters and a width of at least two millimeters.

11. The integrated circuit package of claim 1, wherein said integrated circuit die comprises a memory device containing information related to a peripheral device hosting said integrated circuit package.

12. The integrated circuit package of claim 1, wherein said integrated circuit die comprises an authentication device for authenticating a peripheral device hosting said integrated circuit die.

13. The integrated circuit package of claim 12, wherein said authentication device is configured to authenticate the peripheral device utilizing at least one of a secure hash algorithm, a cryptographic operation, or a password entry operation.

14. The integrated circuit package of claim 1, wherein said integrated circuit die comprises a calibration device used for calibrating an end-use equipment.

15. The integrated circuit package of claim 1, wherein the end-use equipment includes a clamp device that is configured to apply pressure to the enclosure.

16. A method of forming an integrated circuit package, comprising:
    forming an enclosure comprising a dielectric housing, a first electrical contact, and a second electrical contact, said dielectric housing, said first electrical contact, and said second electrical contact forming a contact side of said enclosure, and said first and second electrical contacts are sized to be substantially alignment insensitive to facilitate alignment tolerances for maintaining a direct bondless, and solderless, secure electro-mechanical connection to corresponding contacts of an end-use equipment when pressure is applied to the enclosure by the end-use equipment, the end-use equipment having a surface, the corresponding contacts mounted fixedly on the surface of the end-use equipment so that the corresponding contacts are flush against the surface; and
    forming an integrated circuit die situated within said enclosure and electrically coupled to said first and second electrical contacts.

17. The method of claim 16, wherein said contact side of said enclosure is substantially flat.

18. The method of claim 16, wherein at least a portion of said integrated circuit package is disposed on an internal side of said first electrical contact.

19. The method of claim 18, wherein said integrated circuit die is disposed entirely on said internal side of said first electrical contact.

20. The method of claim 16, further comprising forming an electrical conductor situated within said enclosure, wherein said electrical conductor is attached to said integrated circuit die and to an internal side of said first electrical contact.

21. The method of claim 16, further comprising forming an electrical conductor situated within said enclosure, wherein said electrical conductor is attached to said integrated circuit die and to an internal side of said second electrical contact.

22. The method of claim 16, wherein said first electrical contact includes a length of at least two millimeters and a width of at least two millimeters, and wherein said second electrical contact includes a length of at least two millimeters and a width of at least two millimeters.

* * * * *